US006251739B1

(12) United States Patent
Norstrom et al.

(10) Patent No.: US 6,251,739 B1
(45) Date of Patent: Jun. 26, 2001

(54) INTEGRATED CIRCUIT, COMPONENTS THEREOF AND MANUFACTURING METHOD

(75) Inventors: Hans Erik Norstrom, Solna; Sam-Hyo Hong, Spanga; Bo Anders Lindgren, Sollentuna; Torbjorn Larsson, Uppsala, all of (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/083,100

(22) Filed: May 22, 1998

(30) Foreign Application Priority Data

May 23, 1997 (SE) .................................................... 9701934

(51) Int. Cl.$^7$ ................................................. H01L 21/331
(52) U.S. Cl. ......................... 438/369; 438/318; 438/373; 438/377
(58) Field of Search ................................... 438/318, 325, 438/338, 341, 369, 371, 373, 375, 377, 424, 425, 436, 428, FOR 160, FOR 161, 309

(56) References Cited

U.S. PATENT DOCUMENTS

| 4,301,588 | 11/1981 | Horng et al. . | |
|---|---|---|---|
| 4,381,953 | * 5/1983 | Ho et al. | 438/359 |
| 4,433,471 | * 2/1984 | Ko et al. | 438/327 |
| 4,472,873 | * 9/1984 | Ko | 438/362 |
| 4,734,382 | * 3/1988 | Krisna | 438/207 |
| 4,789,885 | 12/1988 | Brighton et al. . | |
| 4,800,171 | * 1/1989 | Iranmanesh et al. | 438/207 |
| 4,816,423 | * 3/1989 | Havemann | 438/234 |
| 4,866,001 | * 9/1989 | Pickett et al. | 438/330 |
| 4,980,747 | 12/1990 | Hutter et al. . | |
| 5,001,073 | * 3/1991 | Huie | 438/203 |
| 5,098,852 | * 3/1992 | Niki et al. | 438/143 |
| 5,266,504 | 11/1993 | Blouse et al. . | |
| 5,648,279 | * 7/1997 | Imai | 438/202 |

FOREIGN PATENT DOCUMENTS

0724291A2    7/1996  (EP) .

OTHER PUBLICATIONS

Proceedings og the 1991 Bipolar Circuits and Technology Meetings, IEEE 1991 Bipolar Circuits and Technology Meeting 1,Mosaic V—A Very High Performance Bipolar Technology, V. dela Torre et al, pp. 21–24.
Proceedings of the IEEE 1988 Custom Integtrated Circuits Conference, Process HE: A Highly Advanced Trench Isolated Bipolar Technology for Analogue Digital Applications, pp. 22.2.1—22.2.4.

* cited by examiner

Primary Examiner—Stephen D. Meier
Assistant Examiner—Maria Guerrero

(57) ABSTRACT

The present invention relates to a collector pin and a trench in an integrated circuit intended for high speed communication, and to a manufacturing method for these items. The collector pin is achieved by creating an area which is implantation damaged or made amorphous and at least partially doped (139) by means of ion implantation from an upper silicon surface comprised in a semiconductor structure (144) down to a depth lower than the depth of the surrounding field oxide (120), and that the semiconductor structure (144) is then heat treated. The trench (126) is achieved by uncovering a predetermined area of the upper silicon surface (109a), etching the semiconductor structure (144) within the predetermined area to a predetermined depth, uniformly depositing a first oxide layer (129), preferably of the type LPCVD-TEOS over the semiconductor structure, especially in the trench, uniformly depositing a barrier layer (130), preferably of silicon nitride, over the first oxide layer (129), filling the trench (126) by depositing a silicon layer (134, 135), which is subsequently etched back, over the nitride layer (130), especially in the trench (126), and thermally growing a cap oxide (136) over the trench filling (134).

20 Claims, 8 Drawing Sheets

Prior Art

Prior Art

INTEGRATED CIRCUIT, COMPONENTS THEREOF AND MANUFACTURING METHOD

TECHNICAL FIELD

The present invention relates to a method for producing, in the manufacturing of an integrated circuit in a bipolar process, a collector pin and a trench for isolating the semiconductor components comprised in the integrated circuit, and to the collector pin, the trench and the integrated circuit. The collector pin, the trench and the integrated circuit are primarily intended for radio applications or other high-speed communication where components with good performance characteristics are required.

STATE OF THE ART

Traditionally, when manufacturing integrated circuits, so called LOCOS (Local Oxidation of Silicon) isolation is used in combination with junction isolation, to isolate the components of the integrated circuit; see, for example, J. A. Appels et al, "Local Oxidation of Silicon and its application in Semiconductor Technology,", Philips Res. Rep. vol. 25, 1970, pp. 118–132.

In the manufacturing of bipolar components for RF-IC (Radio Frequency-Integrated Circuits) applications, it is common to isolate the individual components in the silicon substrate from each other with etched trenches instead; see, for example, U.S. Pat. Nos. 4,139,442, 4,789,885, P. C. Hunt et al., "Process HE: A Highly Advanced Trench Isolated Bipolar Technology for Analogue and Digital Applications", Proc. IEEE 1988 Custom & Integr. Circuits Conf. Rochester N.Y. May 16–19 1988, and A. Hayasaka et al., "U-Groove Isolation Technique for High Speed Bipolar VLSI's", Proc. IEDM 1982 p. 62.

The technique of trench isolation has also been used for isolating CMOS components, although to a considerably smaller extent, see for example R. D. Rung et. al, "Deep trench isolated CMOS Devices", IEDM, Techn. Dig. Paper 9.6, 1982.

By means of a trench, etched deeply into the silicon, and surrounding a semiconductor component, such as, for example, a bipolar transistor, the capacitance between the bottom diffusion layer and the substrate can be reduced substantially. At the same time better isolation between adjacent components is achieved, that is, an increased immunity against cross talk, while the dimensions of the transistor cell may be reduced at the same time.

Another advantage of trench isolation is that the trenches may be made so deep, approx. 5–10 µm, that they extend through the entire epi-layer of the plate, that is, the active surface layer, all the way down to a heavily doped silicon substrate of low resistance. Thus, the isolating properties and the risk for latch-up are reduced, see for example V. dela Torre et al., "MOSAIC V-A Very High Performance Bipolar Technology", Proc. BCTM 1991, p. 21.

Below, and in connection with the FIGS. 1–3, a commonly used method for making a trench when manufacturing a bipolar transistor of npn type is described.

As starting material a low doped p type monocrystalline silicone substrate 1 of (100) orientation, shown in FIG. 1, is used. A heavily doped bottom diffusion layer of n type, or a buried collector layer 2, which may be made of, for example, an ion implanted layer of arsenic or antimony, is created, whereafter an epitaxic silicon layer 3 of n type is applied with a thickness of approximately 1–2 µm.

At least two variations as to where the so called trench module may be integrated in the process flow are known from the literature. According to a first variation, described by, for example the mentioned P. C. Hunt et al. and U.S. Pat. No. 4,983,226, the trench processing is performed before the definition (with LOCOS technique) of the field areas. According to the second variation, disclosed in, among other documents, EP 0, 724, 291 A2, the trench is created after the definition of the field areas. Both variations aim at the same final result, and in the following, only the first variation will be described.

A layer 4, approximately 1 µm thick, of LPCVD (Low Pressure Chemical Vapor Deposition) oxide, which will function as a hard mask, is then deposited over the plate. Trench openings 5a are then defined in a lithographic way, whereafter the oxide layer 4 is etched back to reveal the underlying silicon surface. Then all photo resist is removed from the structure, whereafter the epitaxial layer 3, the bottom diffusion layer 2 and the silicon substrate 1 are etched back using an anisotropic dry etching until a trench 5 of a predetermined depth, approximately 5–10 µm has been created (see FIG. 1).

As the substrate is made up of lightly doped p type material, usually a small dose of low energy boron is implanted in the bottom of the trench 5 to achieve a channel stop 6, see FIG. 2. The channel stop 6 reduces the current amplification of the parasite transistor (n+ bottom diffusion layer/p− substrate/n+ bottom diffusion layer) which is created and which increases the threshold voltage for the corresponding parasite MOS transistor. If, on the other hand, an epi-material of p−/p+ type is used as a starting material, no such implant is needed.

After the etching of the trench and the implantation of ions the hard mask 4 is removed, whereafter the semiconductor structure is oxidised thermally until a silicon oxide 7 approximately 100 nm is obtained. Then a thin silicon nitride layer 8 is deposited over the semiconductor structure, especially in the trench 5, whereafter the trench is filled with polysilicon 9. Alternatively an insulating or semi-insulating substance, for example silicon oxide may be used, as described in U.S. Pat. No. 4,139,442 or the above mentioned R. D. Rung et al. The filling material, which in Hunt's article is made up of polysilicon, is etched back with dry etching until the silicon nitride layer 8 is uncovered outside the trench opening 5a.

After the filling substance 9 has been etched back, the silicon nitride layer 8 is masked and etched, whereafter silicon is oxidized by means of conventional LOCOS technique for creating both thick field oxide areas 10 and a cap oxide 11 over the trench opening, see FIG. 3. If the trench 5 is already filled with oxide from the beginning, of course no additional cap oxidation is needed.

A collector pin 12, connecting the bottom diffusion layer 2 to the silicon surface, is obtained, whereafter remaining areas of the silicon nitride layer 8 and the silicon oxide layer 7 are removed. FIG. 3 shows the structure resulting from this. As an alternative, the collector pin 12 can be implanted before the trench processing, as described in U.S. Pat. No. 4,958,213.

The above described techniques have a number of drawbacks, which have led to a low yield being noticed when using trench isolation, see for example F. Yang et al. "Characterization of collector-emitter leakage in self-aligned double-poly bipolar junction transistors", J. Electrochem. Soc., vol. 140, no. 10, 1993, p. 3033.

The commonly accepted explanation of the low yield when trench isolation is used is that the trench process (trench etching, sidewall oxidation, filling, re-etching and cap oxidation) introduces defects in the silicon substrate. A relatively detailed description of the problems of trench isolation and suggestions on how to avoid them have been the subject of a number of patents, see for example U.S. Pat. No. 4,983,226, EP 0, 278, 159 A2 and the above mentioned U.S. Pat. No. 4,958,213.

Also, the descriptions are not consistent, in the sense that in U.S. Pat. No. 4,958,213 expresses the opinion that a thickness of the sidewall oxide in the trench of approximately 100 nm functions satisfactorily, whereas in U.S. Pat. No. 4,983,226 an upper limit of 45 nm is recommended for the thickness of the oxide layer. Otherwise, according to U.S. Pat. No. 4,983,226, unnecessary mechanical stress, and thereby dislocations, will be created.

In EP 0, 278 159 A2 it is described how a thin layer of polysilicon is deposited on the inside of the trench, which is later converted, in thermal oxidation, to oxide on the inside of the trench. In this way, unnecessarily heavy oxidation is avoided, and the mechanical tension or stress is reduced.

U.S. Pat. No. 4,958,213 expresses the opinion that the cap oxidation step creates problems. Therefore it is suggested in a final step to refill the upper part of the trench opening with a deposited oxide to reduce the mechanical tension caused by the creation of so-called bird's beaks at cap oxidation. The suggestion both involves complicated process techniques and high manufacturing costs, since it requires two filling steps, which are independent, and following planarization.

In, for example, U.S. Pat. No. 4,983,226, the use of cap oxide, which is simpler, is described. To eliminate the presence of vertical bird's beaks, it is suggested to use a thin layer of silicon nitride on top of the sidewall oxide in the trench and thereby minimize the mechanical stress. A similar method is described in the above mentioned P. C. Hunt et al.

In all the cases described above polysilicon or silicon oxide has been suggested as a filling material in the trenches. This may lead to the presence of voids in the filling, see for example FIG. 7, page 577 in R. D. Rung's article.

SUMMARY OF THE INVENTION

An object of the present invention is to provide an integrated circuit having at least one isolating trench, especially an integrated circuit intended for radio applications or other high speed communication, which is reliable and has good performance characteristics.

Another object of the invention is to provide a trench isolated integrated circuit avoiding one or more of the problems that can arise with prior art.

Yet another object of the invention is to provide an integrated circuit with trenches having no dislocations.

A further object of the invention is to provide a reliable and uncomplicated manufacturing method for an integrated circuit having the above-mentioned properties. In particular, a manufacturing method giving a high yield is strived for.

Other objects of the present invention will become apparent from the description below.

A problem which has not yet been given attention, is that even an integrated circuit with a trench completely without dislocations may be unreliable, unless a collector pin comprised in the integrated circuit can be made without dislocations. At ion implantation of the collector pin according to prior art, defects or dislocations are introduced, especially screw dislocations, which may be confined to the area enclosed by the trench. These defects can then penetrate active p-n junctions, whereby an increased leakage current arises. In the worst case, such an integrated circuit becomes useless.

By recognizing this problem, a reliable integrated circuit without dislocations may be manufactured by combining a trench without dislocations, according to prior art, with a manufacturing method for a collector pin without dislocations.

According to the invention, this method involves providing a collector opening by revealing a predetermined area surrounded by field oxide on an upper surface of silicon in a semiconductor structure by means of etching, providing an area that has been implantation damaged, or made amorphous, and at least partially doped extending from the upper silicon surface down to a depth lower than the depth of the field oxide, implanting ions of a predetermined dose and energy through the upper silicon surface and by subsequently heat treating the semiconductor structure.

Preferably the area is achieved in two steps, the first of which comprises making the surface region of the area amorphous, especially by implanting heavy ions, such as for example arsenic or antimony ions. The second step involves doping the area from its surface region down, especially by letting light ions, such as phosphorus ions be implanted.

The heat treatment is also preferably performed in two steps. First the area is recrystallized from the bottom up by heat treatment, preferably at approximately 550–600° C. for approximately ½–1 hour. Then the doped ions, especially the phosphorus ions are caused to diffuse down towards a doped bottom diffusion layer comprised in the semiconductor structure by means of annealing, preferably at approximately 950° C. for approximately 1 hour.

The invention also comprises an improved manufacturing method for the trench. An oxide layer, preferably of the kind PECVD (Plasma Enhanced Chemical Vapor Deposition) TEOS, is uniformly deposited over the semiconductor structure, especially in the trench. Before the filling of the trench a barrier layer of silicon nitride is deposited as well.

In more detail, the method according to the invention involves the deposition of a hard mask, especially an oxide layer of the kind PECVD (Plasma Enhanced Chemical Vapor Deposition) the deposition of TEOS over a semiconductor structure comprising an upper silicon surface, the creation of a trench opening by, through etching, uncovering of a predetermined area of the upper silicon surface, the creation of a trench by etching of the semiconductor structure within the predetermined area to a predetermined depth, the removal of the hard mask and the first silicon layer by means of etching, the uniform deposition of a first oxide layer, preferably of the kind LPCDV-TEOS, over the semiconductor structure, especially in the trench, the deposition of a barrier layer, preferably of silicon nitride uniformly over the first oxide layer, the depositing of a silicon layer over the silicon nitride layer, especially in the trench, to fill the trench, and the etching of the silicon layer until the underlying nitride layer is uncovered outside of the trench opening, and the thermal growing of a cap oxide over the trench opening.

Preferably the upper silicon surface is covered by an oxide before a first silicon layer, preferably of polysilicon, is deposited over the oxide before the hard mask is deposited.

The method according the invention may also comprise the creation of a tapered trench with a rounded bottom, wet etching and growing a thin thermal oxide before the first oxide layer is deposited, densifying the first oxide layer, depositing a second oxide layer on the nitride layer and filling the trench with microcrystalline silicon. Further improvement of the details will become apparent from the description below.

By means of the present invention, a reliable integrated circuit, with a trench that meets the requirements well, is obtained.

An advantage of the invention is that a relatively simple trench, substantially dislocation-free, may be used in combination with the collector pin according to the invention.

Another advantage is that when an oxide is deposited in the trench less tension is caused than if the oxide is grown thermally. Thus, the oxide may be deposited as a thicker layer, for example approximately 100–200 nm thick, which gives better isolation. If the oxide is densified, the isolating properties will be further improved.

Yet another advantage of the invention is that if the trench is given a tapered shape with a rounded bottom, the risk of mechanical tension and the creation of voids at the filling is reduced. This risk is further reduced if microcrystalline silicon is used for the filling.

BRIEF DESCRIPTION OF THE DRAWINGS

The invention will be described in more detail in the following, with reference to the accompanying drawings, that is FIGS. 4–8, which are only shown to illustrate the invention and therefore should not in any way limit it.

PREFERRED EMBODIMENTS

Figure 1:
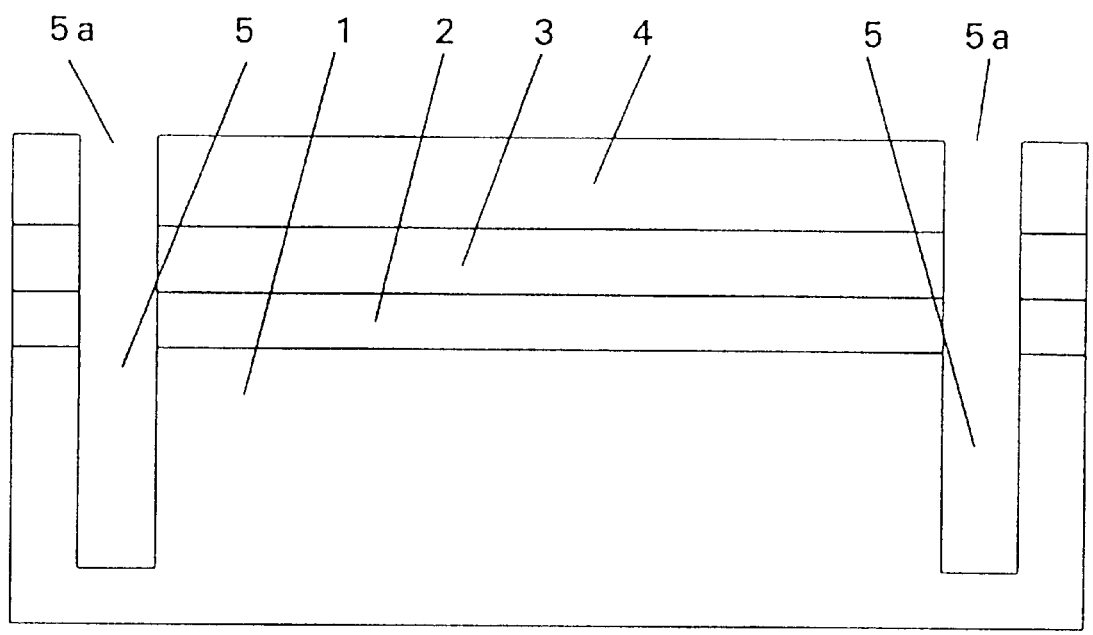
FIGS. 1–3 illustrate, as cross sectional views, a method for manufacturing a trench and a collector pin during the manufacturing of an integrated circuit, according to prior art.
Figure 2:
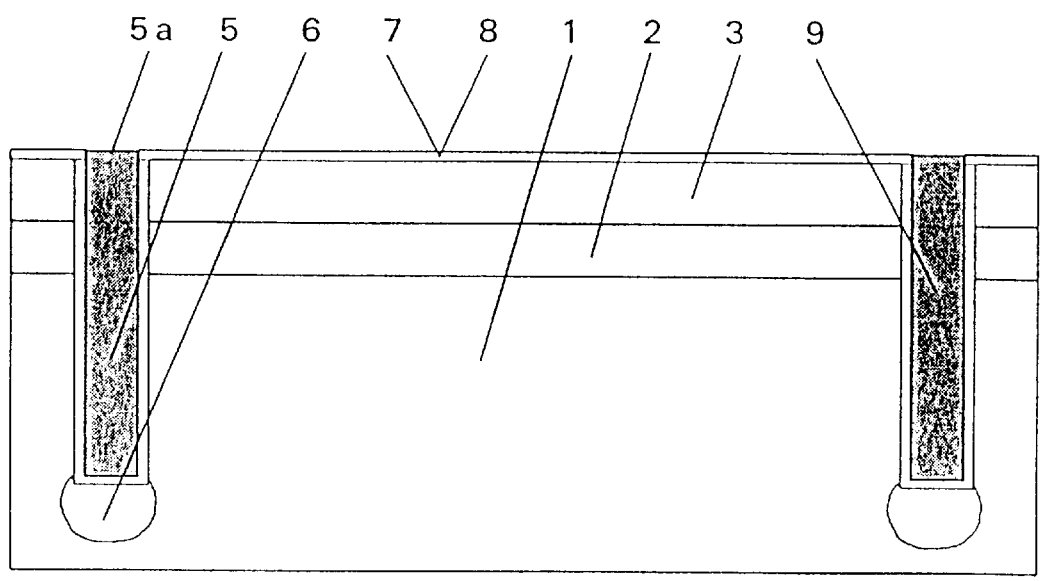
Figure 3:
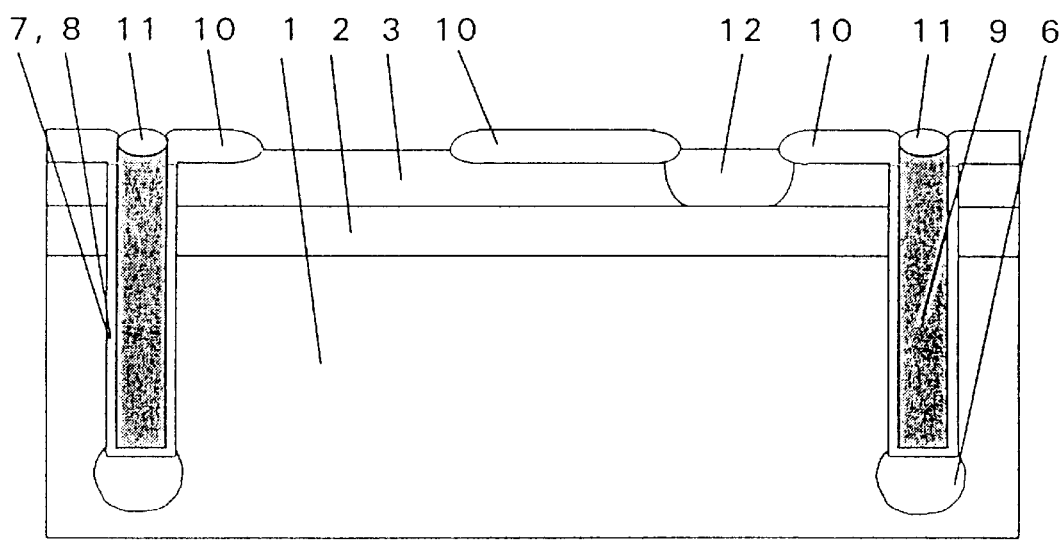
Figure 4:
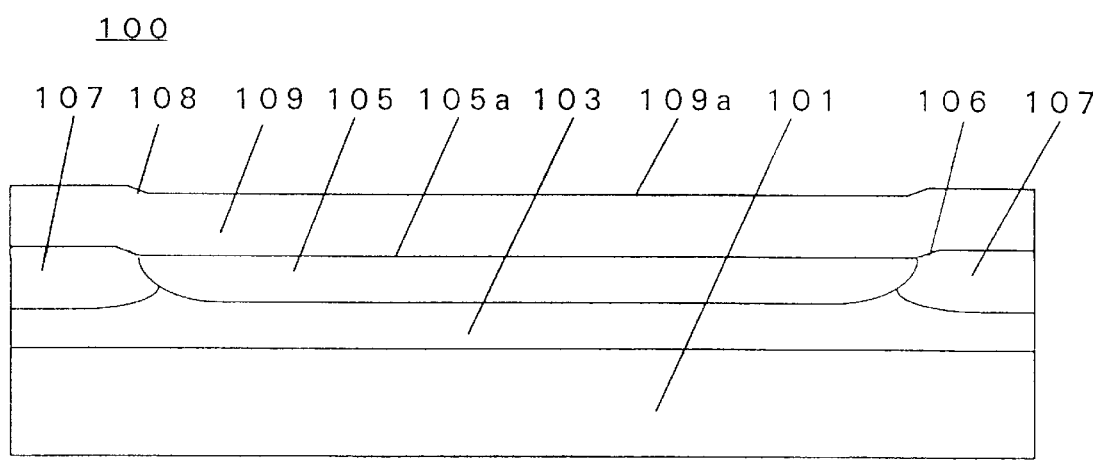
FIGS. 4–7 illustrate, as cross sectional views, a method for manufacturing a trench during the manufacturing of an integrated circuit, according to the present invention.

FIG. 4 shows a cross section of a silicon structure 100 of so called epi type which is characterized in that on a heavily doped substrate 101 (approximately 10 mΩ*cm) of p type, a lightly doped epi layer 103 (approximately 20 Ω*cm), also of p type, has been grown. The grown epi layer 103 is typically 5–10 μm thick.

By starting from a so called epi material of p−/p+ type, no channel stop implant is needed (see the description of the state of the art), which in itself may introduce silicon damages. Boron does not fit the lattice structure of the silicon well, that is, the lattice match is poor.

A protective layer of silicone oxide is deposited on the structure in a way common in the art, for example by thermal oxidation. The oxide layer is masked lithographically before the oxide is removed in the areas which are not protected by resist. A bottom diffusion layer 105, a so called buried collector layer, of n+ type is then introduced in the silicon, by means of ion implantation. A subsequent heat treatment then drives the dopant of n type in to the desired depth, whereafter all the oxide is removed and the structure is globally implanted with a light dose of boron, so that a p doped area 107 is formed. Through this process a height difference or step 106 is achieved between the upper surface 105a of the bottom diffusion layer and the surface of the remaining structure. An approximately 1 μm thick epitaxic layer 109 is then grown over the structure so that the surface 109a of this layer also comprises a step 108.

Figure 5:
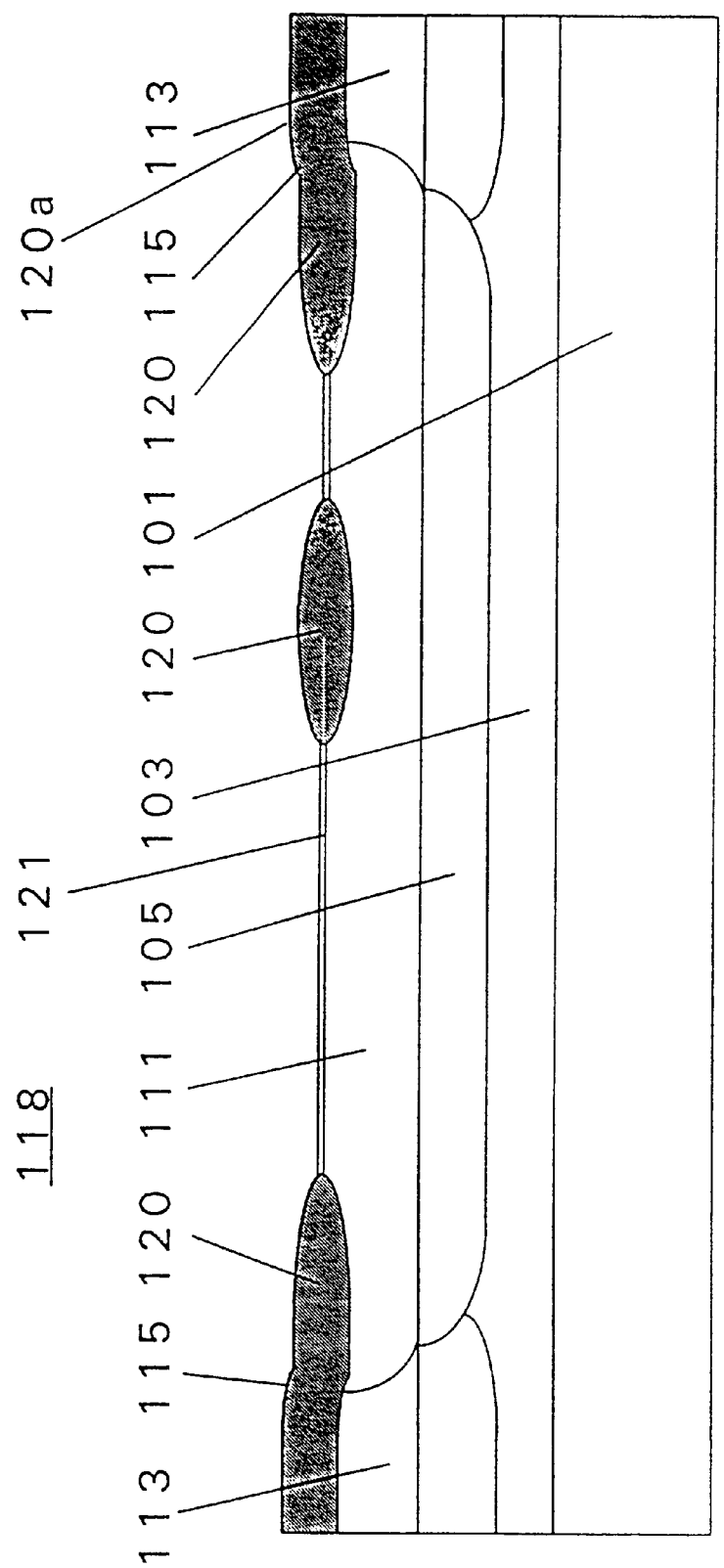

Then the epitaxic surface layer 109 will be doped selectively, according to a well known so called twin well method, to obtain areas of n and p type respectively, so called n well 111 and p well 113, see FIG. 5. This may be done in a way similar to the one described in U.S. Pat. No. 4,958,213 or in L. P. Parillo et al., "Twin-tub CMOS—A technology for VLSI circuits", IEDM Tech. Dig. 1980, p. 752. In this way, the step 108 in the surface 109a is strengthened.

In the n area 111, which is located directly on top of the bottom diffusion layer 105, active semiconductor components will be placed. Field oxide areas 120 are then defined over the structure, with well known LOCOS technique, whereafter a Kooi oxide 121 is thermally grown over the structure. This Kooi oxide 121 is typically 30–40 nm thick. The structure 118 obtained after the processing described above, before the trench module is started, is shown in FIG. 5. Note that there is a step 115 in the surface 120a of the field oxide above the junction between the n well 111 and the p well 113.

Figure 6:
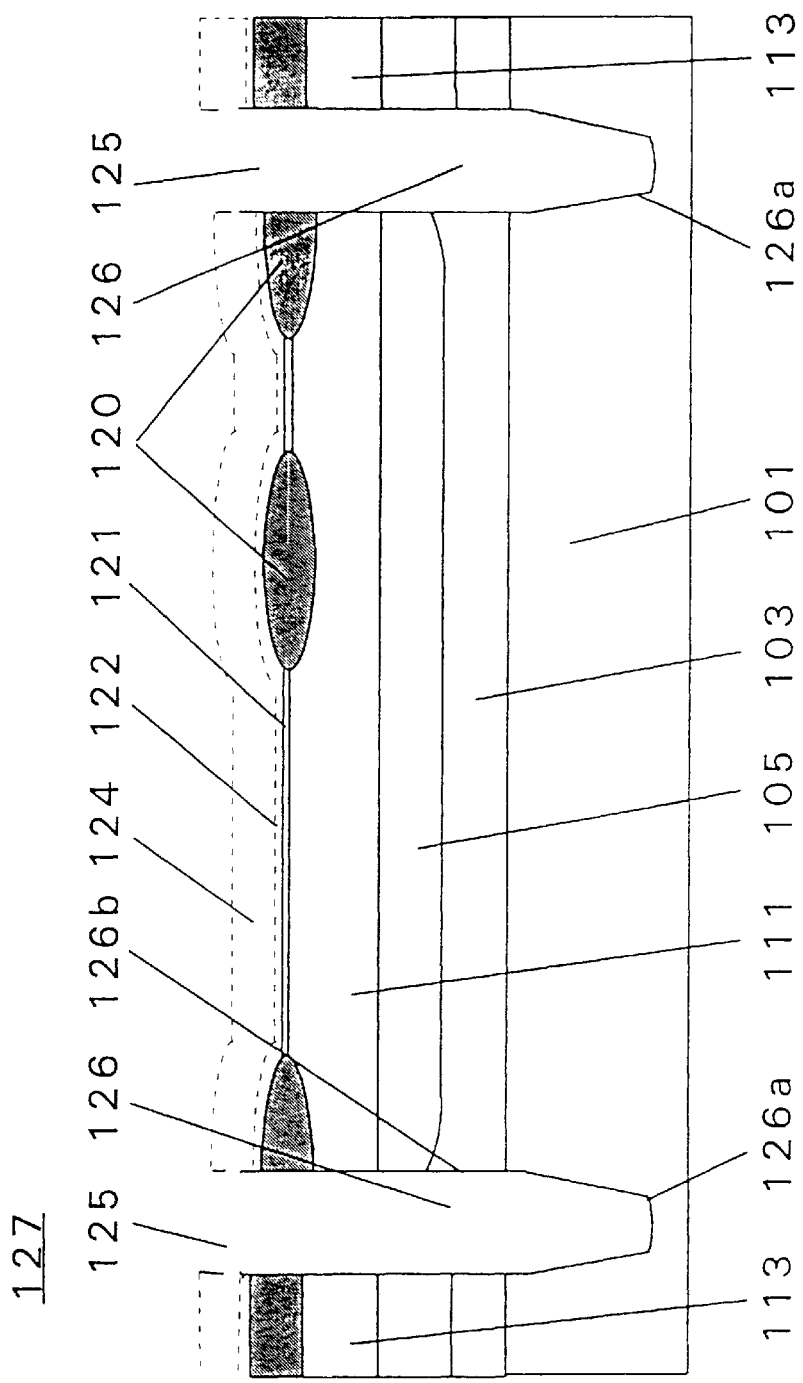

The trench module is started, after Kooi oxidation, by depositing a thin layer 122, typically approximately 50 nm thick and of polysilicon, preferably by means of LPCVD technique over the structure, see FIG. 6. On top of said polysilicon layer 122 a hard mask is deposited, which is preferably comprised of an approximately 300 nm thick oxide layer 124. Preferably the oxide is PECVD-TEOS.

A trench opening 125 is then defined lithographically, whereafter the oxide layer 124, the polysilicon layer 122 and the field oxide 120 are etched back with dry etching so that the underlying silicon surface is uncovered. This can suitably be done sequentially in a plasma etching system of multi chamber type. Conventional $CHF_3/CF_4/Ar$ chemistry is used for the oxide etching and $Cl_2/HBr$ chemistry for the polysilicon etching. In the uncovered opening 125, a trench 126 will be created.

The photo resist is removed, whereupon the areas 111, 113, the bottom diffusion layer 105, the layer 103 and the substrate 101 are etched back with anisotropic dry etching, preferably with $NF_3/HBr/He/O_2$ chemistry, until the trenches 126 have obtained the desired depth, preferably approximately 5–10 μm. A dry etching process of several steps is used with advantage according to the invention to give the trench a tapered shape, especially the last micrometers, and a rounded bottom 126a, see FIG. 6. The tapered shape facilitates the subsequent filling of the trench and the rounded trench bottom 126a reduces the effects of mechanical tension.

When the trench etching is finished, the oxide layer 124 and the underlying polysilicon layer 122, which has served as an etch stop at the removal of the oxide layer 124, are removed. The resulting structure 127 is shown in FIG. 6.

Note that no channel stop implant of boron down in the trench 126 is needed in this case, as the trench 126 extends down in the p+ substrate 101. Thus, there is no risk of inversion along the trench bottom 126a. Said boron implant should be avoided, since it can cause dislocations in the silicon.

After the trench etching, according to the invention, a small amount of silicon (approximately 20 nm) is removed from the bottom 126a and sidewalls 126b of the trench by means of wet etching/cleaning, preferably in SC-1, that is, $NH_4OH/H_2O_2/H_2O$, which has been heated to approximately 80° C. in a well known manner, see for example W. Kern et al. "Cleaning solution based on hydrogen peroxide for use in semiconductor technology", RCA Rev. Jun. 1970, p. 187. In this way any pollution, such as metals and surface damages in the silicon caused in the trench etching are removed, which could later have caused dislocations in the silicon and thus low yield. Then the Kooi oxide 121 is removed with wet etching.

From several of the previously referenced patents it is evident that oxidation of the trench walls 126b may cause the formation of dislocations for example by the introduction of mechanical tension. To eliminate this risk, according to the invention a thin uniform oxide layer 129 is deposited, preferably TEOS, of a thickness of 50–®nm by means of LPCVD technique over the structure, see FIG. 7. As the LPCVD-TEOS layer 129 has a good step coverage, the layer 129 along the sidewalls 126a and the bottom 126a of the trench is achieved. Alternatively another type of oxide is deposited, using another deposition technique, for example PECVD or SACVD (Sub-Atmospheric Chemical Vapor Deposition) technique. The important thing is that an even, uniformly deposited oxide is provided in the trench 126.

Said oxide layer 129 should then be densified, especially at approximately 900° C. in an oxygen environment. Hereby the isolating properties of the oxide layer are improved. Also, one is not restricted to a maximum oxide thickness of approximately 45 nm which is described in the state of the art. Instead the TEOS layer may be deposited to a substantially higher thickness of the order of magnitude of 100–200 nm, without the mechanical tension increasing too much. In this way, the isolating properties of the trench 126 are substantially improved. Alternatively a thinner, not thicker than 50 nm, but preferably 10 nm thick thermal oxide may be grown along the sidewalls 126b and the bottom 126a of the trench before the LPCVD-TEOS layer is deposited (not shown in the figures).

After densifying the TEOS layer 129 a thin, approximately 50 nm thick barrier layer 130 of preferably silicon nitride is deposited over the structure and down in the trench 126. On top of the barrier layer 130, preferably a thin, approximately 30 nm thick TEOS layer 132 is deposited with LPCVD technique. This TEOS layer 132 later serves as an etch stop when etching back the trench filling.

In the trench 126, thus a laminate consisting of densified TEOS/silicon nitride/TEOS 129, 130 132 will be present— or alternatively a four layer laminate of thermal oxide/ densified TEOS/silicon nitride/TEOS 129, 130, 132.

The trench 126 is then filled by depositing an approximately 1 µm thick silicon layer 134, 135 over the structure using LPCVD technique, whereby the trench 126 is completely filled with the silicon. Preferably according to the invention microcrystalline silicone is used instead of polysilicon, since the risk of incomplete filling, that is, the creation of voids, is reduced.

Figure 7:
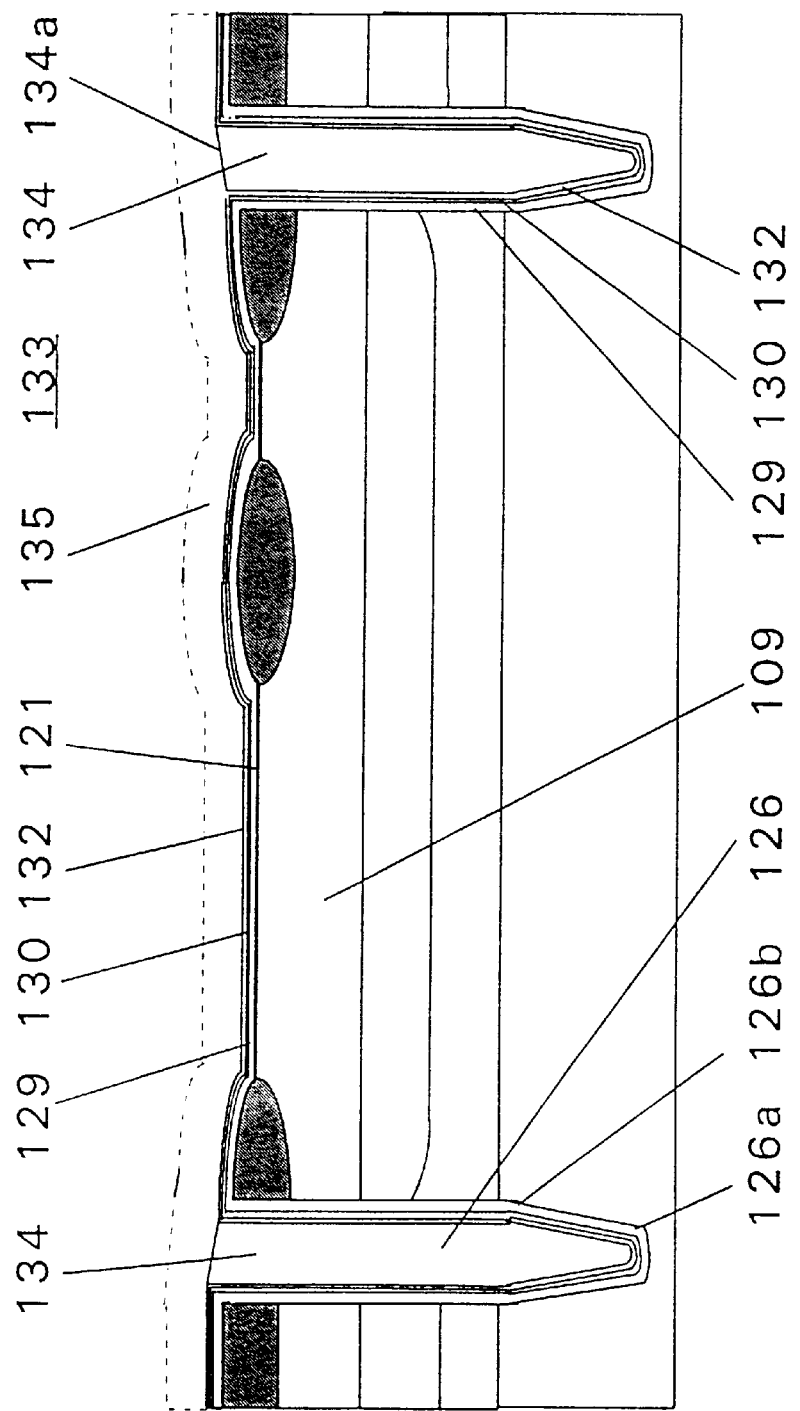

After the filling, excess microsilicon 135 is removed from the surface by means of plasma etching. The etching is stopped when the TEOS layer 132 has been uncovered outside the trench opening 125. The obtained structure 132 is shown in FIG. 7. Note that the upper surface 134a of the silicon filling comprises a step and thus is at least partially tilted.

Figure 8:
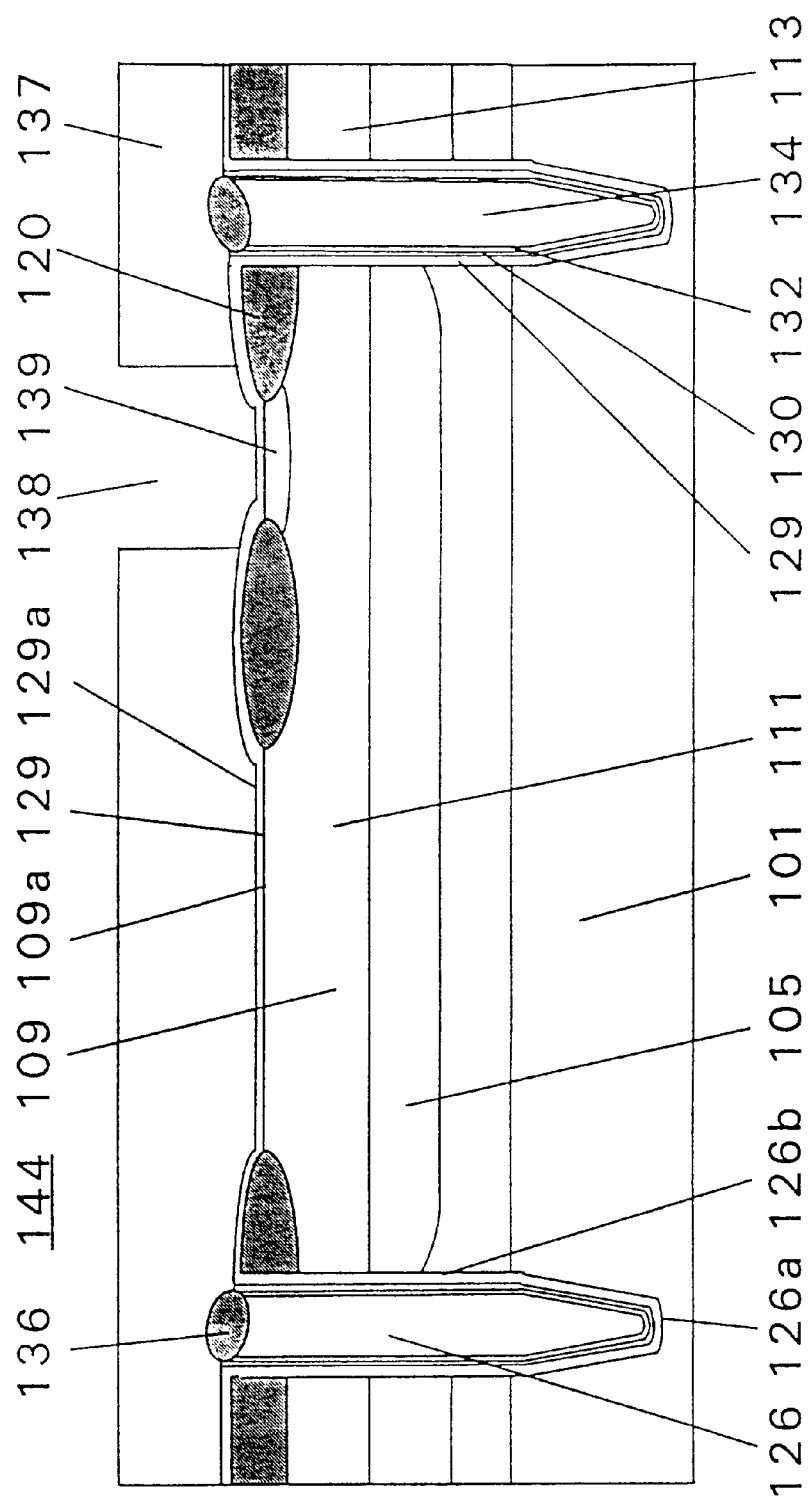
FIG. 8 illustrates, as a cross-sectional view, a method for manufacturing a collector in when manufacturing an integrated circuit according to the present invention.

Subsequently an approximately 300 nm thick cap oxide 136 is grown thermally over the trench opening 125, see FIG. 8. This preferably takes place in a humid atmosphere at approximately 950° C. After the cap oxidation is ended the TEOS layer 132 and the underlying nitride layer 130 are removed, for example by means of dry etching. In this case, the surface of the TEOS layer functions as an etch stop.

The structure can then be masked with a photo resist 137 and if necessary etched to achieve the definition of a collector opening 138, which is to be surrounded by field oxide 120 The etching may be stopped on the upper silicon surface 109a, but the TEOS oxide 129 may also be left in the collector opening 138.

An implantation damaged or amorphous and at least partially doped area 139 is then achieved from the upper silicon surface 109a down to a depth lower than the depth of the field oxide 120. This happens by ions of a predetermined dose or doses and energies being implanted through the upper silicon surface 109a. The obtained structure 144 which is shown in FIG. 8, is heat treated after removal of the photo resist 137, in part for the area 139 to heal/recrystallize and in part for the dopants to diffuse down towards the bottom diffusion layer 105 and create electric contact with it.

Normally, the field oxide 120 is grown to a thickness of at least 500 nm. To observe the desired safety margins the damaged area 139 is thus achieved to a maximum depth of approximately 200 nm.

To avoid problems with formation of dislocations or defects at the heat treatment, that is, the recrystallization, the implantation is preferably carried out in two steps.

In a first step the surface region of the area, comprising the silicon surface 109a and an upper region of the area 139, is made amorphous, especially through the implantation of heavy ions, such as, for example, arsenic, antimony or argon ions. Preferably arsenic ions are used at a dose of the order of magnitude of $1*10^{15}$ ions/cm$^2$ and with an energy of the order of magnitude of 80 keV.

In the second step the area 139 is doped from its surface region down, especially by the implantation of light ions such as phosphorus ions. Suitable parameters here are a dose of the order of magnitude of $3*10^{15}$ ions/cm$^2$ and an energy of the order of magnitude of 50 keV. The parameters are adapted so that the main part of the implantation damages are kept within the surface region which has already been made amorphous.

The heat treatment is also preferably carried out in two steps, a recrystallization step and a diffusion step.

The area 139 is recrystallized from the bottom up by heat treatment, preferably at approximately 550–600° C. for approximately ½–1 hour. In the recrystallization the damaged area will be healed from the bottom up while keeping the original crystal orientation. Whereby the arising of crystal defects, twins or screw dislocations is avoided. The latter, screw dislocations, are especially troublesome at trench isolation as they tend to be locked up in the area surrounded by the trench. These defects may then penetrate the active p-n junctions of the bipolar transistor, thus causing increased leakage currents.

If the implantation energy is selected too high, the surface layer will not be made amorphous, but instead an amorphous (damaged) region will be obtained between the surface layer and the inner part of the crystal. At subsequent heat treatment, these areas (the surface layer and the inner part of the crystal) will both serve as a substrate for regrowth of the grid. When the fronts meet, crystal defects arise. From, for example U.S. Pat. No. 4,958,213, it is clear that both the implantation energy and the dose of phosphorus have been selected so that the latter case will arise, with resulting dislocation problems.

Finally, the doped ions, especially the phosphorus ions, are made to diffuse down towards the doped bottom diffusion layer or the buried collector layer 105 through annealing, preferably at approximately 950° C. for about 1 hour. Whereby an electric connection to said bottom diffusion layer 105 is created.

The continued processing, that is, the making of active components, metallizing, etc., is done in ways well known in the art and will not be described in more detail here.

An integrated circuit manufactured according to the preferred method described above, according to the invention, is reliable and has good performance characteristics.

By achieving a collector pin without dislocations a previously ignored problem of, in some cases, low yield, has been solved. The collector pin can be combined with a trench, substantially without dislocations according to well known techniques, but is preferably used together with the trench according to the invention.

The disclosed trench may be made more effective than before by depositing an oxide, preferably an LPCVD-TEOS oxide and a barrier layer, especially of silicon nitride, in the trench before the filling.

Hereby an oxide thickness up to at least 200 nm is allowed without introducing an extent of tensions and/or defects, such as dislocations, which may damage the integrated circuit. A further oxide layer may be deposited on the barrier layer.

The integrated circuit with the collector pin according to the invention and/or the inventive trench are particularly well suited for radio and other high frequency applications.

Of course, the invention is not limited to the embodiments described above and shown in the drawings, but may be modified within the scope of the appended patent claims. The invention is obviously not limited as regards choice of material, dimensions, such as layer thicknesses or geometries.

In addition, the invention also comprises the creation of the trench earlier in the process, especially before the growing of the field oxide areas, creating the collector pin before the creation of the trench as well as the creation of the inventive collector pin in combination with a trench made in any conventional manner.

What is claimed is:

1. A method for manufacturing a collector pin in a bipolar process in the manufacturing of an integrated circuit, especially an integrated circuit intended for radio applications or other high speed communication, the method comprising the steps of:

providing an area in a semiconductor structure including a silicon, or silicon oxide, layer having an upper surface, wherein said area is surrounded by a field oxide region having a first depth, forming a substantially dislocation-free isolating trench in said semiconductor structure, wherein said trench surrounds said area, producing a collector opening by uncovering, by means of etching, said area, implanting heavy ions of a first dose and energy through said upper surface to create a heavy ion damaged area within said collector opening from said upper surface down to a second depth less than said first depth, implanting light ions of a second dose and energy through said created area, said second dose and energy of light ions being chosen so that implantation damage due to said step of implanting light ions is kept within said second depth, said step of implanting light ions occurring after said step of implanting heavy ions, and subsequently heat treating of the semiconductor structure.

2. A method according to claim 1, wherein said second depth is achieved to a maximal depth of approximately 200 nm and that said first depth of surrounding field oxide is selected to be at least 500 nm.

3. A method according to claim 1, wherein said heat treating step comprises a step of heat treating said semiconductor structure at approximately 550–600 C. for for approximately ½–1 hour so that said area created by implanting heavy ions is recrystallized from the bottom up heat.

4. A method according to claim 1, wherein the implanted heavy ions are one of arsenic or antimony ions.

5. A method according to claim 3, wherein said step of heat treating at approximately 550–600 C. is followed by a step of annealing at approximately 950 C. for about 1 hour so that the implanted ions diffuse down towards a bottom diffusion area comprised in said semiconductor structure.

6. A method according to claim 4, wherein the implanted heavy ions are arsenic ions of a dose of the order of magnitude of $1*10^{15}$ ions/cm$^2$ and having an energy of the order of magnitude of 80 keV.

7. A method according to claim 4, wherein the implanted light ions are phosphorus ions.

8. A method according to claim 7, wherein the implanted light ions are phosphorus ions of a dose of an order of magnitude of $3*10^{15}$ ions/cm$^2$ and having an energy of an order of magnitude of 50 keV.

9. A method of forming a collector pin in manufacturing of an integrated circuit comprising:

providing a multilayer semiconductor structure having a silicon layer;

forming a field oxide region that surrounds an area of a surface of said silicon layer, said field oxide region laterally separating said area from all other areas, said field oxide region extending into said silicon layer to a first depth;

forming a substantially dislocation-free isolation trench, wherein said area is surrounded by said isolation trench;

implanting heavy ions into said silicon layer through said area, said implanting step creating a heavy ion implanted region that is partially doped and that is at least one of implantation damaged and implantation made amorphous, said heavy ion implanted region having a second depth from said surface that is less than said first depth;

implanting light ions into said heavy ion implanted region, said step of implanting light ions occurring after said step of implanting heavy ions, and said step of implanting light ions occurring at an energy and dose so that resulting light ion implantation damage is substantially kept within said second depth; and annealing said multilayer semiconductor structure.

10. The method according to claim 9, wherein said heavy ion implanted region has a maximum depth of 200 nm and said thickness of said first depth is at least 500 nm.

11. The method according to claim 9, said implanted heavy ions being one of arsenic and antimony.

12. The method according to claim 11, said implanted heavy ions being arsenic.

13. The method according to claim 12, wherein said step of implanting arsenic is at a dose of order of magnitude of $10^{15}$ ions/cm$^2$ and having an energy of order of magnitude of 80 keV.

14. The method according to claim 13, wherein said implanted light ions are phosphorus ions.

15. The method according to claim 14, wherein said step of implanting phosphorus is at a dose of order of magnitude of $3 \times 10^{15}$ ions/cm$^2$ and having an energy of order of magnitude of 50 keV.

16. The method according to claim 15, wherein said step of annealing said multilayer structure comprises a step of annealing resulting in recrystallizing, towards said surface, of said heavy ion implanted region including said resulting light ion implantation damage.

17. The method according to claim 16, wherein said step of annealing resulting in recrystallizing does not result in a substantial diffusion of said phosphorus ions.

18. The method according to claim 17, wherein said step of annealing said multilayer structure further comprises a second step of annealing, occurring after said step of annealing resulting in recrystallizing, resulting in a substantial diffusion of said phosphorus ions.

19. The method according to claim 18, wherein said step of annealing resulting in recrystallizing is accomplished by heat treatment of approximately 550–600 C. for approximately 2–1 hour.

20. The method according to claim 19, wherein said second step of annealing is accomplished through annealing at approximately 950 C. for about 1 hour.

* * * * *